(12) United States Patent
Phua et al.

(10) Patent No.: US 7,200,096 B2
(45) Date of Patent: Apr. 3, 2007

(54) METHOD AND APPARATUS FOR THE MODULATION OF MULTILEVEL DATA ARRAYS

(75) Inventors: Cheng Chiang Phua, Singapore (SG); JingFeng Liu, Pittsburgh, PA (US); Tow Chong Chong, Singapore (SG); Yi Hong Wu, Singapore (SG); Jun Li, Singapore (SG)

(73) Assignee: Data Storage Institute, Singapore (SG)

( * ) Notice: Subject to any disclaimer, the term of this patent is extended or adjusted under 35 U.S.C. 154(b) by 1392 days.

(21) Appl. No.: 09/932,491

(22) Filed: Aug. 17, 2001

(65) Prior Publication Data

US 2002/0051273 A1    May 2, 2002

(51) Int. Cl.
    *G11B 7/00* (2006.01)
(52) U.S. Cl. ............................ 369/103; 369/59.23
(58) Field of Classification Search ........... 369/110.01, 369/102, 103, 112.1, 11; 235/380; 713/193; 359/11, 10, 22, 21, 32; 380/54
    See application file for complete search history.

(56) References Cited

U.S. PATENT DOCUMENTS

| | | | | |
|---|---|---|---|---|
| 5,377,176 A | * | 12/1994 | Redfield | 369/103 |
| 5,510,912 A | | 4/1996 | Blaum et al. | 359/21 |
| 5,627,664 A | * | 5/1997 | Trisnadi | 369/102 |
| 5,715,316 A | * | 2/1998 | Steenblik et al. | 380/54 |
| 5,727,226 A | | 3/1998 | Blaum et al. | 395/800 |
| 5,940,514 A | * | 8/1999 | Heanue et al. | 713/193 |
| 6,512,733 B1 | * | 1/2003 | Kawano et al. | 369/110.01 |
| 6,536,665 B1 | * | 3/2003 | Ray et al. | 235/380 |

OTHER PUBLICATIONS

Australian Patent Office Search Report dated Aug. 23, 2000, 5 pages.

* cited by examiner

*Primary Examiner*—Thang V. Tran
*Assistant Examiner*—Kim-Kwok Chu
(74) *Attorney, Agent, or Firm*—Jenkens & Gilchrist, P.C.

(57) ABSTRACT

A method and apparatus for modulating multilevel data arrays to make them suitable for storage in multidimensional storage media, such as in holographic storage. In order to get a uniform signal of constant energy at the recording plane, first the multilevel data array, $V_{out}$, displayed on a spatial light modulator, has frequent transitions between symbols of different levels, and second it has constant energy. The energy is defined as the summation of the values of the symbols in the data array. The first constraint is achieved using $V'_{in} = V_{in} \oplus_q M(q, Z_O)$, where $\oplus_q$ stands for the modulo-q addition operation; $M(q, Zo)$ is a data array with randomly distributed symbols of q levels, where q is the number of levels and $Z_O$ is the seed used to generate the random multilevel data array. In order to equalize the energy of the modulated data array $V'_{in}$, a q-ary balanced complementary method is used to complement the symbols of the input multilevel data array, $V'_{in}$, in a horizontal row-by-row readout order terminating after the first ii symbols. The final modulated output data array, $V_{out} = |C_{i,j} - V'_{in}|$, simultaneously satisfies both the constraints, where the elements of $C_{i,j}$ are (q–1)'s for the first ii elements in a horizontal row-by-row readout order, the others are 0's.

28 Claims, 7 Drawing Sheets

METHOD AND APPARATUS FOR THE MODULATION OF MULTILEVEL DATA ARRAYS

TECHNICAL FIELD OF THE INVENTION

The present invention pertains in general to the preparation of data for storage in multidimensional memories, and more particularly, to the modulation of multilevel data arrays to make them suitable for storage in multidimensional storage media.

BACKGROUND OF THE INVENTION

Conventional serial bit-oriented information storage devices are approaching their physical storage capacity limit. Multidimensional storage devices having novel recording mechanisms, redundant storage, and parallel recording and retrieval potentials may be able to display higher storage capacity and transfer rates. In addition, when one recorded symbol is able to represent many bits rather than one bit, multilevel data storage may be able to push the storage capacity and data transfer rate even higher.

One such storage device records information as multiplexed interference patterns in different common volumes within holographic media, from which the patterns can be independently retrieved. Page-oriented recording and retrieval improves the data transfer rate.

In holographic storage a single monochromatic, coherent beam of light is preprocessed and passed through a spatial light modulator which is controlled by a sequence of digital data arrays. The modulator is in the form of a 2-Dimensional array of pixels each of which has a particular level of brightness. The level of brightness, q, at a given pixel location represents log2 q bits. The modulated, light beam exiting the spatial light modulator carries the information of the multilevel data array as multilevel symbols.

In Fourier hologram recording geometry, the signal light is the Fourier transform of the light exiting the spatial light modulator. This Fourier transform represents the spatial frequency content of the multilevel data array on the spatial light modulator. A lens is interposed between the spatial light modulator and the recording medium to obtain the Fourier transform of the light.

This resulting signal beam is interfered with a coherent reference beam at or near the recording plane. The resulting interference pattern has bright bands where the signal and the reference wavefronts constructively interfere with and enhance one another, and dark bands where the wavefronts destructively interfere and cancel each other out.

The interference pattern is then recorded as a 3-Dimensional hologram in a holographic recording medium, as variations of the index of refraction of the medium. The pattern of the resultant refraction index change has a half period shift with respect to the interference pattern.

Since the holographic medium has finite dynamic range of index of refraction, the brighter the interference pattern is, the greater the refraction index will change, and the less index change range will be left. If the input multilevel symbols are not distributed evenly in the data array, the interference pattern will have peaks which will saturate the recording medium. In this event the interference process acts like a nonlinear filter which makes the recording and reconstruction not a true reproduction of the original input multilevel data array.

The multilevel image pages are reconstructed by illuminating the recorded hologram with the original reference beam and detecting the readout with a matched 2-Dimensional array of photo-detectors, such as charge coupled devices. The multilevel data array can then be retrieved from the detected image, and the original data array can be decoded from the data array.

Holographic storage records the modulation depth of the interference between the reference and the signal beams. The modulation depth is determined by the relative ratio between the two beams. Therefore, wide variations in the ratio between signal beam and the reference beam during the recording will result in wide variations in the intensity of the reconstructed image.

SUMMARY OF THE INVENTION

The invention is a method of modulating multilevel data arrays for storing in multidimensional storage media. The method includes the following steps:

receiving a 2-Dimensional multilevel data array in which each entry in the array has one of the multilevel values;

generating a multilevel sequence of random numbers in which each number of the sequence has one of the multilevel values;

performing an arithmetic or logic operation between respective elements of the data array and respective random numbers of the sequence to produce an intermediate data array showing non-correlation and even distribution of the multilevel symbols.

The modulation is based on whole arrays or pages of data rather than subblocks.

A q-ary complementary method may be used in addition to equalise the energy of the intermediate data array.

The sequence of random numbers may be generated using a formula and a seed. The sequence may be reproduced using the formula by the presentation of the seed.

The random sequence may be generated using the following formula:

$$Z_i = (aZ_{i-1} + c)(\text{mod } m)$$

where m (the modulus), a (the multiplier), c (the increment), and $Z_O$ (the seed) are non-negative integers.

The random sequence may be transformed into a multilevel array of random numbers having the same size as the data array.

A modulo-q addition operation may be performed between respective elements of the data array and the multilevel array of random numbers to produce an intermediate data array showing non-correlation and even distribution of the multilevel symbols.

The intermediate array may be checked for whether there is large difference between the numbers of different multilevel symbols. If there is, a different seed is feed into the random number generator instead, and another random data array is generated. Several different seeds are enough to modulate the multilevel data array to have frequent transitions.

The frequent and random transitions between the multilevel data array symbols of different levels, in either dimension across the data page avoids peaks in the recording plane. In other words, the multilevel symbols in the data array are distributed evenly across the whole data array.

The seed may be encoded in a multilevel redundant format which can combat errors. It may then be appended as an additional column or row to the modulated array.

Notably, the entire first portion of the modulator of the present invention does not require a conversion table, and a large memory is not needed. The only information that may have to be stored in the modulator is the index of the seed to be used for the random number generator which is built inherent in the modulator by software or hardware.

A control data array $C_{i,j}$, may be generated, where the elements of it are (q–1) for the first ii elements, in a row-by-row readout order, and the remainder of it is 'O's'. And selecting 'ii' so that when an output array is produced using the formula:

$$V_{out}=|C_{i,j}-V'_{in}|$$

then the output array has a sum equal to the sum when all the symbols in the multilevel data have an exact middle level value. When the energy is constant, wide variations in the ratio between the signal beam and reference beam are avoided during recording.

An index may indicate the value of 'ii', that is how many symbols have been complemented, and this index can be stored as well. Since the modulation is based on the whole large data page, the redundancy is small.

A final row and column of the output array may be used to store the indices used to indicate the seed information and ii of the data array $C_{i,j}$. Since the modulation is based on the whole data page, the size of the row and column used to record this modulation information is large, and redundancy protects the information from burst errors.

As an alternative to the two step modulation process described so far a combined modulator with the following transfer function $$V_{out}=|C_{i,j}-V_{in}\oplus_q M(q, Z_O)|$$

may be employed.

The modulation technique may be used as part of a process for storing pages of data in a multidimensional memories. In particular the output array may be used to control a spatial light modulator for recording the output array in holographic storage media.

Feedback may be applied during recording to reduce errors in the process. The feedback may involve reading out the pages of data after they have been read in, and comparing the readout with the input data array. If there is a large difference between the original and detected data, the recording may be continued.

It is an advantage of at least some examples of the invention that the resulting multilevel data pages may be stored in a holographic recording medium which eliminates uneven distribution of light, grey or dark regions in either dimension across the data pages. As a result the interference modulation depth is kept relatively uniform so that the distortion between the input data page and the reconstructed data page is minimised.

It is another advantage of at least some examples that multilevel data pages may have constant energy regardless of the input data page content. The energy is defined as the summation of the values of the total multilevel data array symbols. The energy may be modulated to be equal to that when all the pixels on spatial light modulator are turned exactly half on. That is to say that, the summation of the values of the total data array is equal to the summation when all the data array symbols are assigned to have an exact middle level.

In a second aspect, the invention is a method of demodulation including the reverse steps to those described above.

In another aspect, the invention is a modulator for modulating multilevel data arrays for storing in multidimensional storage. The modulator includes:

a data port for receiving a 2-Dimensional multilevel data array in which each entry in the array has one of the multilevel values;

a random number generator to generate a multilevel sequence of random numbers in which each number of the sequence has one of the multilevel values;

computing means to perform an arithmetic or logic operation between respective elements of the data array and respective random numbers of the sequence to produce an intermediate data array showing non-correlation and even distribution of the multilevel symbols.

The computing means may also be able to perform a q-ary complementary method to equalise the energy of the intermediate data array.

An arithmetic linear congruential random number generator may be used to generate random numbers with uniform distribution over the interval [0,1].

The random number generator may use a formula and a seed such that the sequence may be reproduced using the formula by the presentation of the seed.

The random number generator may use the following formula:

$$Z_i=(aZ_{i-1}+c)(\text{mod } m)$$

where m (the modulus), a (the multiplier), c (the increment), and $Z_O$ (the seed) are non-negative integers.

The computing means may be able to transform the random number into a multilevel array of random numbers having the same size as the data array.

The computing means may be able to perform a modulo-q addition operation between respective elements of the data array and the multilevel array of random numbers to produce an intermediate data array showing non-correlation and even distribution of the multilevel symbols.

The computing means may be able to check the intermediate array for whether there is large difference between the numbers of different multilevel symbols. If there is, a different seed is feed into the random number generator instead, and another random data array is generated. Several different seeds are enough to modulate the multilevel data array to have frequent transitions.

The computing means may be able to encode the seed in a multilevel redundant format which can combat errors. It may then append the encoded seed as an additional column or row to the modulated array.

Notably, the entire first portion of the modulator of the present invention does not require a conversion table, and a large memory is not needed. The only information that may have to be stored in the modulator is the index of the seed to be used for the random number generator which is built inherent in the modulator by software or hardware.

The computing means may be able to generate a control data array $C_{i,j}$, where the elements of it are (q–1) for the first 'ii' elements, in a row-by-row readout order, and the remainder of it is 'O's'. And the computing means may be able to select 'ii' so that when the final modulated output data array is produced using the formula:

$$V_{out}=|C_{i,j}-V'_{in}|$$

then the final modulated output array has a sum equal to the sum when all the symbols in the multilevel data have an exact middle level value.

An index may indicate the value of 'ii', that is how many symbols have been complemented, and this index can be stored as well.

As an alternative to the two step modulation process described so far a combined modulator with the following transfer function $$V_{out}=|C_{i,j}-V_{in}\oplus_q M(q,Z_O)|$$

may be employed.

The modulator may be used as part of a system for storing pages of data in a multidimensional memories.

A feedback loop may be applied during recording to achieve uniform recorded data page in the storage media. The feedback loop may involve reading out the pages of data after they have been read in, and comparing the readout with the input data array. If there is a large difference between the original and detected data, the recording process may be continued.

A further aspect of the invention is a demodulator having the reverse structure as the modulator.

It is an advantage of some examples that the modulator, and demodulator are easily implemented.

It is also an advantage that the modulator may minimise errors and increase the accuracy of the data pages read by the array of the photo-detecting elements thereby reducing re-read operations and increasing data access speeds.

It is another advantage that the design parameters required to ensure the accuracy of the data stored and retrieved from the holographic medium may be eased in some examples of the invention.

It is yet another advantage of the present invention to make the subsequent equalisation and data detection easy and accurate.

A yet further advantage of at least some examples of the invention is that modulation codes may have no error propagation if a random error falls into any position in the recorded multilevel data array.

BRIEF DESCRIPTION OF THE DRAWINGS

An example of the invention will now be described with reference to the accompanying drawings, in which:

FIG. 2 illustrates an input 20×20 four-level data array $V_{in}$ to be modulated;

FIG. 3 illustrates a 20×20 data array $M(q, Z_O)$ with a random distribution of four-level symbols;

Figures 5, 6:
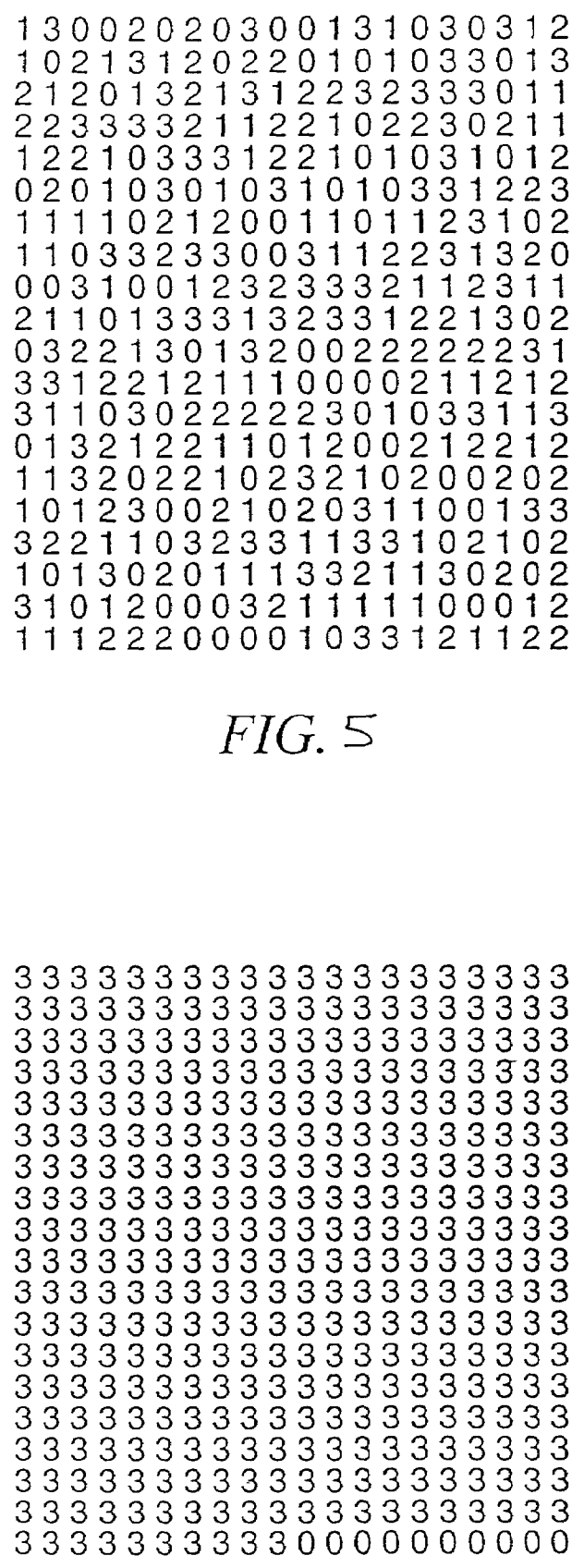

FIG. 5 is array $V'_{in}$ at the output of the modulator of FIG. 4;

FIG. 6 is array $C_{ij}$ which equalises the energy of the array $V'_{in}$;

FIG. 9 is a schematic block diagram of a modulator encompassing both the first and second modulators of FIG. 4 and FIG. 5. such that a combined output is obtained; and FIG. 10 and FIG. 11 are illustrations of undesirable patterns of multilevel symbols.

DETAILED DESCRIPTION OF THE INVENTION

Figure 1:
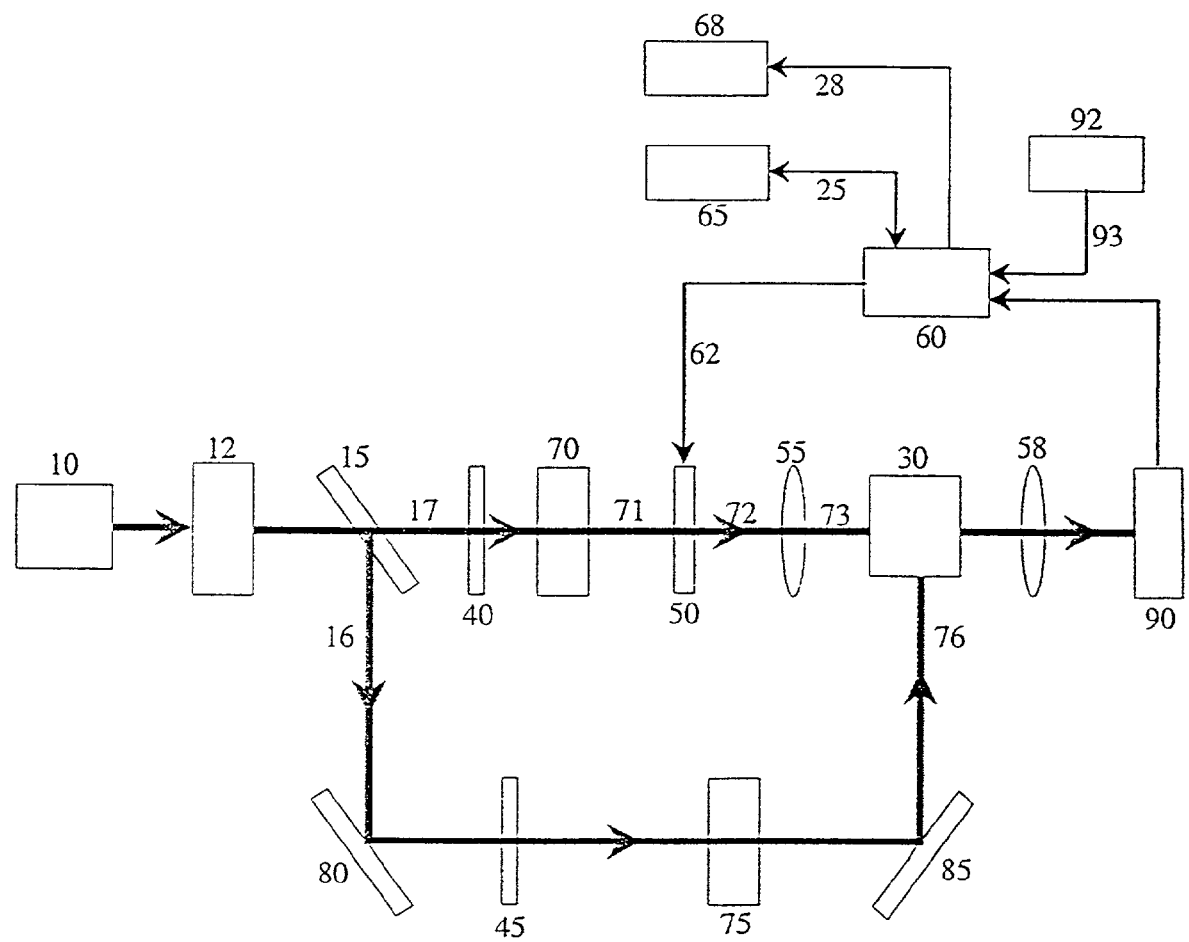
FIG. 1 is a schematic block diagram of a holographic storage system.

Referring now to FIG. 1, there is illustrated the general scheme of a holographic storage system which is operable to store information in a holographic recording medium 30 and extract that data.

A laser light source 10 generates a single monochromatic, coherent light beam that is directed through to the appropriate orientation by a beam steering assembly 12. The beam is then split by a conventional beam splitter 15 into a reference beam 16 and a signal, or object, beam 17.

The signal beam 17 then passes through a set of beam-forming optics 70 which expand and collimate the signal beam 17 to become expanded signal beam 71. The expanded signal beam 71 is used to illuminate an information-bearing spatial light modulator 50. The spatial light modulator 50 has a two-dimensional array of pixels which pass, partially attenuate, or block parts of the signal beam 71 according to the values of the pixels in the multilevel data array. A shutter 40 is used to control illumination of the holographic recording medium 30 by passing or blocking the laser beam 17.

The spatial light modulator 50 and a Fourier transform lens 55 are located in the signal beam path between the laser source 10 and the holographic recording medium 30. The lens 55 is located at its focal length distance from both the spatial light modulator 50 and the holographic recording medium 30. The Fourier transform of the light distribution imposed on the signal beam by spatial light modulator 50 is formed in a designated recording section of the holographic recording medium 30. The lens 55 thus takes the point sources of light which comes from spatial light modulator 50 as diverging beams of light and directs them to the holographic recording medium 30 as parallel beams. Each parallel beam corresponds to light transmitted through one of the pixels of the two-dimensional array of the spatial light modulator 50. These individual beams become signal beam 73 and arrive at different angles at the holographic recording medium 30 from lens 55 to overlap at the recording section of the holographic recording medium 30.

The reference beam 16, which is split by the beam splitter 15, is directed by a mirror 80 to a set of beam-forming optics 75 which expands and collimates the reference beam 16 to become expanded reference beam 76. Hologram multiplexing is achieved by changing the angle of the reference beam 76 through movement of the mirror 85. In this way the reference beam wavefront 76 illuminating the recording section of the holographic recording medium 30 is changed. A shutter 45 is used to control illumination of the holographic recording medium 30 by passing or blocking the laser beam 16.

Both the output reference beam 76 and the individual beams 73 from the Fourier lens 55 arrive simultaneously and interfere with one another in the holographic recording medium 30.

Shutter 40, located in the signal beam path 17 between the beam splitter 15 and the beam expander 70, blocks the signal beam 17 during reconstruction of the hologram. An inverse Fourier transform lens 58 is located on the side opposite to the holographic recording medium 30. The inverse Fourier transform lens 58 is positioned at its focal length distance from the holographic recording medium 30 and a two-dimensional data detector array 90, such as a charge-coupled device array. The information retrieval from the holographic recording medium 30 is reconstructed by the reference beam 76 movement so that the original reference beam is directed to the recording section of the holographic recording medium 30 so as to generate the transform image of the recorded hologram that is directed to the detector array 90. The detector array 90 has the same two-dimensional array pattern as the spatial light modulator 50 so that its output corresponds to the multilevel data array output of the spatial light modulator 50.

A data controller 60 receives input data 92 from a data bus 93. From the data controller 60, the input data sequence is then transmitted to the modulation unit 65 to be modulated. The data sequence once modulated becomes a multilevel data array which is output to the data controller 60 through data bus 25. This modulated multilevel data array is then transmitted to the spatial light modulator 50 through data bus 62. During the recording phase, the data controller 60 also receives data array output from the data detector array 90 by standard detection technique; and compares the difference between the multilevel data array detected from the recorded hologram in the holographic recording medium 30 and the original multilevel data array displayed on the spatial light modulator 50. If there is a large difference between the original and the detected information, the underexposed regions of the hologram is exposed further by controlling the states of the spatial light modulator 50. The recording process will continue until no large difference observed between the retrieved multilevel data array and the intended original multilevel data array. This adaptive recording technique can reduce non-uniformity in the multilevel data page and prevent under-exposure and over-exposed.

During reading phase, the data controller 60 receives data array from the data detector array 90, and sends this data array to the demodulation unit 68 to be decoded. The demodulated multilevel data array is then transmitted as the output through data bus for further processing.

The data controller 60 is also electrically connected to the shutters 40 and 45, multiplexer 85 and the moveable holographic recording medium 30, for the necessary control of the hologram recording and reading processes.

The data modulator 65 is either a hardware or a software construct into which an input data page consisting of one data array is directed. The data symbols on the data page are modulated to produce the output data page which satisfies specific modulation requirements. Here, the whole input data page is modulated as a whole data array, in order to avoid the periodical effect in the Fourier recording plane which would happen when the input data page is divided into small blocks to be modulated.

Figures 2, 3:
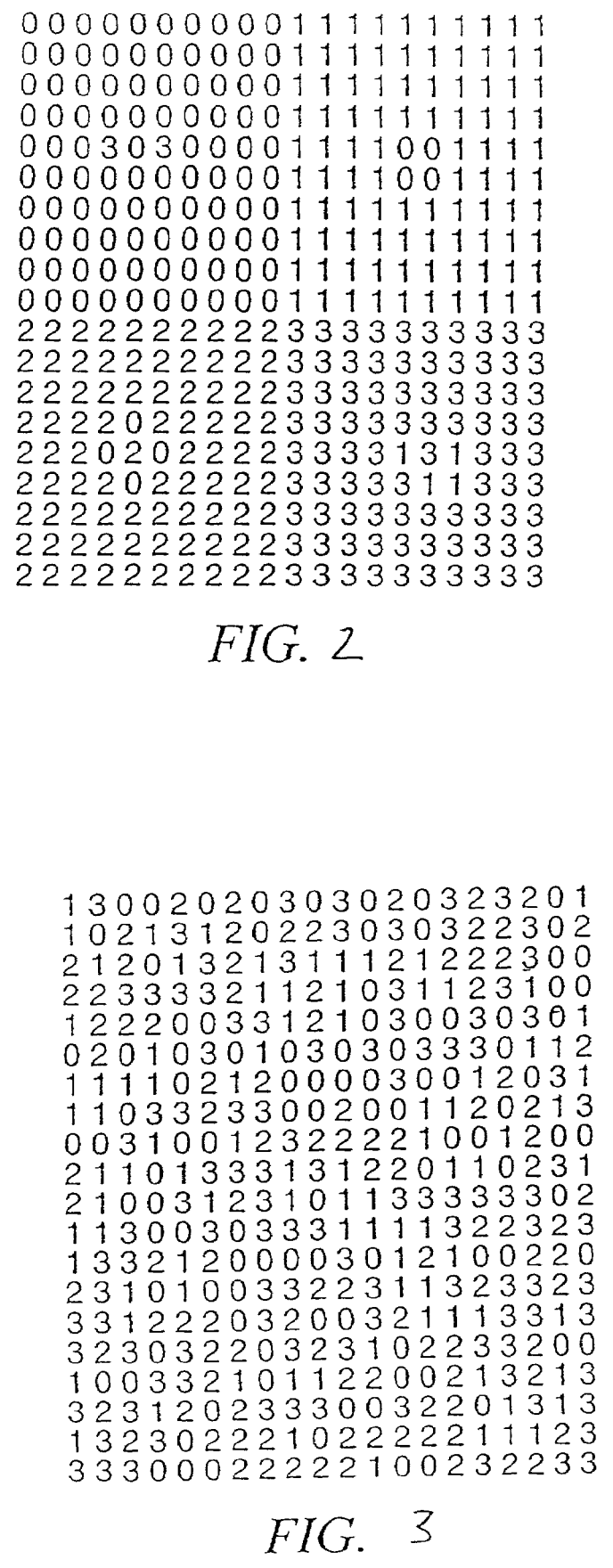

Take for an input multilevel data array, $V_{in}$, the 20×20 four-level data array shown in FIG. 2.

The construction of a data array with random distribution of multilevel symbols will now be described. First, an arithmetic linear congruential random number generator is used to generate random numbers for the uniform distribution over the interval [0,1]. The recursive formula used to generate a random sequence $Z_1, Z_2, \ldots$, is $$Z_i = (aZ_{i-1} + c) \pmod{m}$$

where m (the modulus), a (the multiplier), c (the increment), and $Z_O$ (the seed) are non-negative integers. The "mod" means that to obtain $Z_i$, $(aZ_{i-1}+c)$ is divided by m and let $Z_i$ be the remainder of this division. By careful choice of parameter m, a and c (o<m, a<m, and $Z_O$<m), given a seed $Z_O$, a sequence of independent random number is generated which can be reproduced by the presentation of $Z_O$. Let $U_i = Z_i/m$, the generated random numbers $U_i$ (for i=1, 2, ...) are distributed uniformly over the interval [0,1] and do not show any correlation with each other. Assuming that the number of levels of the multilevel data array is q, the interval [0,1] is divided into q sections, where each section corresponds to a level. Then, the random sequence can be transformed into a random sequence of multilevel symbols. By folding it, a multidimensional data array of random distribution of multilevel symbols can be generated. It is referred to as $M(q, Z_O)$, and a 20×20 data array is shown in FIG. 3. This array has a random distribution of four-level data array symbols.

Figure 4:
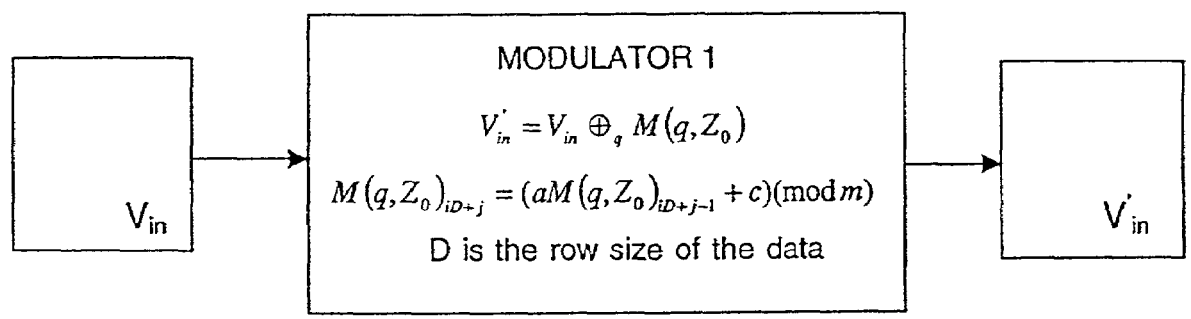
FIG. 4 is a schematic block diagram of a modulator which takes an input array and modulates it with a data array having a random distribution of multilevel symbols.

By use of a modulo-q addition operation between the input data array $V_{in}$ and $M(q, Z_O)$, the resulting intermediate data array:

$$V'_{in} = V_{in} \oplus_q M(q, Z_O)$$

is generated according to the transfer function illustrated in FIG. 4, and the intermediate data array, $V'_{in}$, is illustrated in FIG. 5.

As $V_{in}$ is signal data, it must have correlation relationship within the symbols. $M(q, Z_O)$ is a random data array, and it does not have correlation within symbols. So $V'_{in}$ will also show non-correlation and even distribution of the multilevel symbols. After that, the resultant data array is checked for whether there is large difference between the numbers of different multilevel symbols. If there is, a different seed is feed into the random number generator instead, and another random data array is generated. Several different seeds are enough to modulate the multilevel data array to have frequent transitions.

The frequent transitions between the multilevel data array symbols of different levels, in either dimension across the data page avoids peaks in the recording plane. In other words, the multilevel symbols in the data array are distributed evenly across the whole data array.

In order to be able to retrieve the original input array $V_{in}$ from the output array $V_{out}$ that is eventually stored in the holographic recording medium, it is necessary to indicate which seed is used. This information is encoded in a multilevel redundant format which can combat errors. It is then appended as an additional column or row to the modulated array $$V'_{in} = V_{in} \oplus_q M(q, Z_O)$$

The only information that has to be stored in the modulator of FIG. 4 is the index of the seed to be used for the random number generator which is built inherent in the modulator by software or hardware. Meanwhile, the structure of the encoder and decoder are the same.

A q-level data array consists of symbols of value from 'O' to 'q–1'. First, a complementary relationship is defined between level 'i' and 'q–1–i'. From now then, when a complementary operation is imposed on level 'i', the resultant level is 'q–1–i'. Note that when q=2n+1, and n is a positive integer, the complementary level of 'n' is 'n' itself. Under the definition of 'complementation', the q levels are classified into q/2 complementary pairs, i and (q–1–i), exclusive of the special pair, n and n, when q=2n+1.

A control data array $C_{i,j}$, is then designed where the elements of it are (q–1) for the first 'ii' elements, in a row-by-row readout order, the rest of it should be 'O's'. According to Knuth's complementary method, there is a certain 'ii', when the final modulated output data array $$V_{out} = |C_{i,j} - V'_{in}|$$

has a sum equal to the desired value.

Similarly, as with the first index for the seeds applied to the input array $V_{in}$, the index indicates the value of i, how many symbols have been complemented, can be stored as well. Since the modulation is based on the whole large data page, the redundancy is small.

Figure 7:
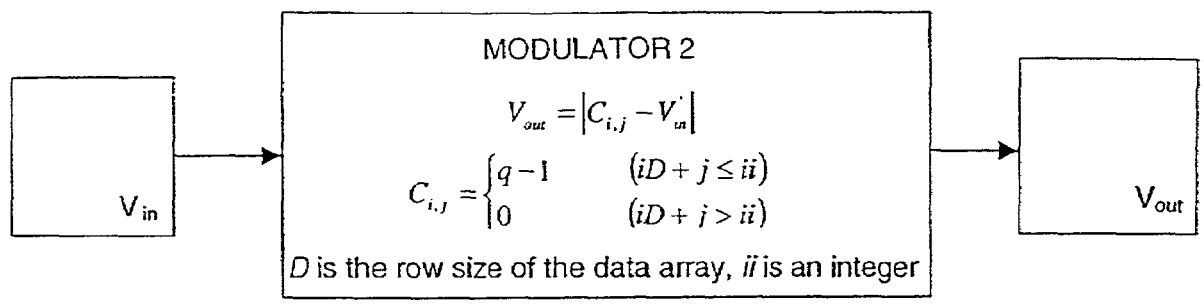
FIG. 7 is a schematic block diagram of a modulator which takes an input array and modulates it with a q-ary balanced complementary method.
Figures 7, 8:
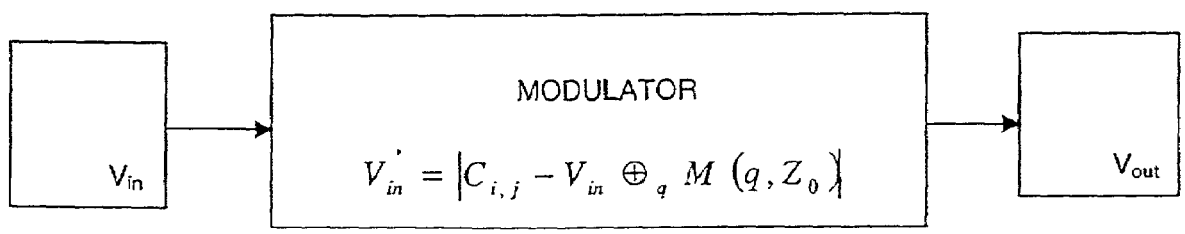
FIG. 8 is the final modulated array.

The data array $C_{i,j}$, shown in FIG. 6, is used to equalise the energy of $V'_{in}$ according to the transfer function of FIG. 7 to produce the final output data array, $V_{out}$, shown in FIG. 8. The row and column indicated are the index used to indicate the seed information and 'ii' of the data array $C_{i,j}$. As there are 20 symbols to record a bit information (which seed is used) and 20 symbols to read eleven bits (ii), error control coding is used to protect them. In holographic data storage, the modulation is based on the whole data page, the size of row and column used to record the modulation information is larger. The redundancy to protect the information is large enough to combat large burst errors.

This technique can be used to keep the energy of the multilevel data page constant, which energy is equal to the sum when all the symbols in the multilevel data have an exact middle level value. When the energy is constant wide variations in the ratio between the signal beam and reference beam are avoided during recording.

Figures 10, 11:
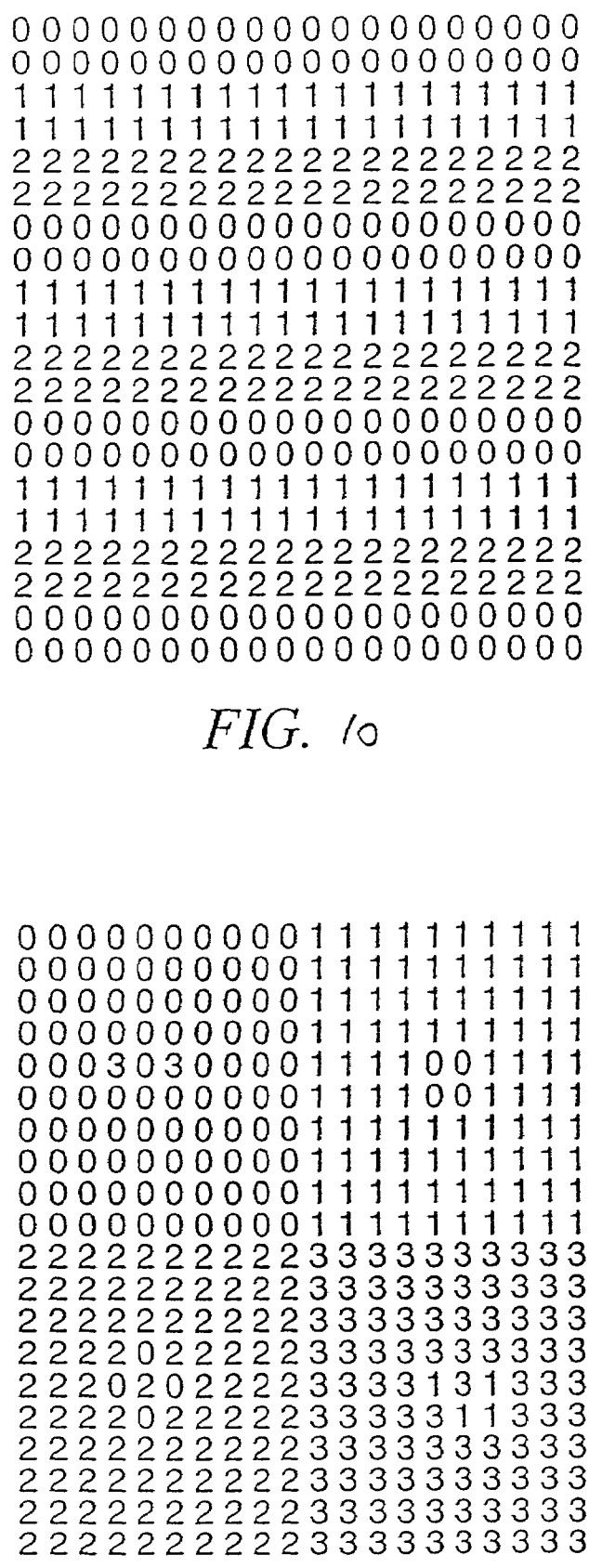

The combined modulator of transfer function of FIG. 9 achieves both the modulation schemes of the modulator of FIG. 4 and the modulator of FIG. 5. The output of FIG. 8 can be compared with the output of FIGS. 10 and 11 where the invention has not been applied, and where it can be seen that symbols are not distributed evenly in the data array, and there are wide variations in the ratio between signal beam and the reference beam during the recording.

In summary, the modulator modulates multilevel data pages to be stored in a holographic recording medium. The multilevel symbols are redistributed across the whole data page and hold the energy of the whole multilevel data page constant. To achieve this, the modulator uses an arithmetic random number generator to generate a data array of randomly distributed multilevel symbols. The first constraint is achieved by modulo-q addition operation between the input data array and the data array just generated. To modify the summation of the data page, a q-ary complementary operation is defined according to Knuth's complementary method. The symbols of the input array, $V'_{in}$, are complemented in a horizontal readout order terminating after the first 'ii' bits, where the final modulated data array meets the constant energy requirement. The modulation methods can be extended to multidimensional case easily.

Although a preferred example has been described in detail, it should be understood that various changes, substitutions and alterations can be made without departing from the spirit and scope of the invention as defined by the appended claims.

What is claimed is:

1. A method of modulating multilevel data arrays for storage in multidimensional storage media, said method comprising:
   receiving a 2-dimensional multilevel data array in which each entry in said multilevel data array has one of a plurality of multilevel values;
   generating a multilevel sequence of random numbers wherein each number in said multilevel sequence of random numbers comprises one of said multilevel values;
   performing at least one of an arithmetic and a logic operation between elements of said multilevel data array and respective random numbers, from said multilevel sequence of random numbers, in order to produce an intermediate data array providing non-correlation and an even distribution of the multilevel symbols; and
   performing a q-ary complementary method to substantially equalize the energy associated with said intermediate data array, said multilevel data array having q levels.

2. The method according to claim 1, wherein said sequence of random numbers is generated using a formula and a seed.

3. The method according to claim 2, wherein said sequence is reproduced by using said formula by the presentation of said seed.

4. The method according to claim 3, wherein said seed is encoded in a multilevel redundant format to minimize data errors, said multilevel redundant format being appended as an additional column or row to said multilevel data array.

5. The method according to claim 2, wherein said sequence of random numbers is generated by using the formula:

$$Z_i = (aZ_{i-1} + c)(\mathrm{mod}\, m)$$

wherein m (the modulus), a (the multiplier), c (the increment), and $Z_i$ (the seed) are non-negative integers.

6. The method according to claim 1, wherein said sequence of random numbers is transformed into a multilevel array of random numbers having a same size as said multilevel data array.

7. The method according to claim 1, wherein a modulo-q addition operation is performed between respective elements of said multilevel data array and a q-level array of random numbers in order to produce an intermediate data array showing non-correlation and an even distribution of said multilevel symbols.

8. The method according to claim 7, further including:
   checking said intermediate data array for whether there is a large difference between the numbers of said multilevel symbols; and
   using a different seed to generate a random number if the difference is said large difference.

9. The method according to claim 7, further comprising generating a control data array $C_{i,j}$, where the elements of said control data array are (q−1) for the first 'ii' elements, in a row-by-row readout order, and a remainder of said control data array is 'O's', wherein 'ii' is selected such that when an output array is produced using the formula:

$$V_{out} = |C_{i,j} - V'_{in}|$$

wherein $V'_{in}$ is said intermediate data array, such that said output array comprises a sum equal to a situation when the sum of all the symbols in said multilevel data array have an exact middle level value.

10. The method according to claim 9, further comprising storing an index which indicates the value of 'ii', wherein 'ii' is the number of symbols that have been complemented.

11. The method of claim 10, wherein at least one of a row and a column of said output array are used to store an indices used to indicate seed information and 'ii' of said control data array $C_{i,j}$.

12. A method according to claim 1, further including producing an output data array in accordance with the function:

$$V_{out} = |C_{i,j} - V_{in} \oplus_q M(q, Z_O)|$$

wherein $V_{in}$ is an input data array;
wherein $C_{i,j}$ is a control data array: and
wherein $M(q, Z_O)$ is a random data array.

13. The method according to claim 1, further comprising outputting a multilevel output data array, and wherein said method of modulating multilevel data arrays for storage in multidimensional storage media is utilized in a process for storing at least one page of data in a multidimensional memory.

14. The method according to claim 13, wherein said multilevel output data array is used to control a spatial light modulator for recording said multilevel output data array in a holographic strorage media.

15. The method according to claim 14, further comprising:
   reading a page of data from said multidimensional memory; and
   comparing said read page of data with said at least one page of data that was stored in said multidimensional memory; if a predetermined difference between said read page and said stored page exists, then repeating storing said page of data in said multidimensional memory.

16. A modulator for modulating multilevel data arrays for storage in a multidimensional storage device, said modulator comprising:
   a data port for receiving a 2-dimensional multilevel data array, each entry in said multilevel data array has a multilevel value;
   a random number generator for generating a multilevel sequence of random numbers wherein each said random number in said sequence of random numbers is created by using respective multilevel values from said entries in said multilevel data array;
   computing means for computing an arithmetic or logic operation on respective entries from said multilevel data array and said sequence of random numbers in order to produce an intermediate data array providing a non-correlation and an even distribution of multilevel values; and
   wherein said computing means is adapted to perform a q-ary complementary for substantially equalizing the energy of the intermediate data array, wherein there are q levels.

17. The modulator according to claim 16, wherein said random number generator comprises an arithmetic linear congruential random number generator for generating random numbers with uniform distribution over the interval [0,1].

18. The modulator according to claim 16, wherein said random number generator uses a formula and a seed such that a sequence can be reproduced using said formula and said seed.

19. The modulator according to claim 18, wherein said formula is:

$$Z_i = (aZ_{i-1} + c)(\text{mod } m)$$

wherein m (the modulus), a (the multiplier), c (the increment), and $Z_i$ (the seed) are non-negative integers.

20. The modulator according to claim 16, wherein said computing means is operable to transform said random number into a multilevel array of random numbers having the same dimensions of said multilevel data array.

21. The modulator according to claim 20, wherein said computing means is adapted to perform a modulo-q addition operation between respective entries of said multilevel data array and said multilevel array of random numbers in order to produce said intermediate data array.

22. The modulator according to claim 21, wherein said computing means is operable to check said intermediate array for a greater than a predetermined difference between the numbers of different multilevel symbols; if said greater than said predetermined difference exists, then said computing means instructs a new seed to be provided to said random number generator so that another random number data array is generated.

23. The modulator according to claim 22, wherein said computing means is operable to encode said seed in a multilevel redundant format for minimizing errors, said encoded seed is appended as additional column or row to an output modulated data array.

24. The modulator according to claim 16, wherein said computing means is operable to generate a control data array $C_{i,j}$, wherein the elements of said control data array $C_{i,j}$ are (q-1) for the first 'ii' elements, in a row-by-row readout order, and the remainder of said control data array $C_{i,j}$ is '0's; said computing means is operable to select 'ii' so that when the final modulated output data array is produced using a formula:

$$V_{out} = |C_{i,j} - V'_{in}|$$

said final modulated output data array has a sum equal to a sum when all elements in said multilevel data array have an exact middle level value.

25. The modulator according to claim 24, further comprising an index for indicating the value of 'ii' and the number of symbols that have been complimented.

26. The modulator according to claim 16, wherein said computing means performs a transfer function according to the equation:

$$V_{out} = |C_{i,j} - V_{in} \oplus_q M(q, Z_O)|$$

wherein $V_{in}$ is an input data array:
wherein $C_{i,j}$ is a control data array: and
wherein $M(q, Z_O)$ is a random data array.

27. A system for storing pages of multilevel data in a multidimensional memory, said system comprising a modulator, said modulator comprising:
   a data port for receiving a 2-dimensional multilevel data array, each entry in said multilevel data array has a multilevel value;
   a random number generator for generating a multilevel sequence of random numbers wherein each said random number in said sequence of random numbers is created by using respective multilevel values from said entries in said multilevel data array;
   computing means for computing an arithmetic or logic operation on respective entries from said multilevel data array and said sequence of random numbers in order to produce an intermediate data array providing a non-correlation and an even distribution of multilevel values; and
   wherein said computing means is adapted to perform a q-ary complementary for substantially equalizing the energy of the intermediate data array, wherein there are q levels.

28. The system of claim 27, further comprising a feedback loop, operable during recoding of said multilevel data array into said multidimensional memory, said multidimensional memory being a holographic medium, said feedback loop reading out a page of data from said holographic medium after said a page has been recorded, then comparing the difference between said read out page and said multilevel data array in order to determine differences between said multilevel data array and said read out page.

* * * * *